United States Patent
Barry

(10) Patent No.: US 7,466,284 B2
(45) Date of Patent: Dec. 16, 2008

(54) CHIP SEAL RING HAVING A SERPENTINE GEOMETRY

(75) Inventor: Robert L. Barry, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 43 days.

(21) Appl. No.: 11/564,875

(22) Filed: Nov. 30, 2006

(65) Prior Publication Data

US 2008/0129623 A1 Jun. 5, 2008

(51) Int. Cl.
*H01Q 21/00* (2006.01)

(52) U.S. Cl. .............................. 343/867; 343/700 MS; 343/841

(58) Field of Classification Search ................ 343/841, 343/741, 895, 700 MS, 867
See application file for complete search history.

(56) References Cited

U.S. PATENT DOCUMENTS

| 6,022,791 | A | * | 2/2000 | Cook et al. ................. 438/458 |
| 6,127,989 | A | | 10/2000 | Kunz |
| 6,316,835 | B1 | * | 11/2001 | Chen et al. ................. 257/774 |
| 2007/0115606 | A1 | * | 5/2007 | DeVries et al. ............. 361/220 |

* cited by examiner

*Primary Examiner*—Trinh Vo Dinh
*Assistant Examiner*—Dieu Hien T Duong
(74) *Attorney, Agent, or Firm*—Downs Rachlin Martin PLLC

(57) ABSTRACT

A chip seal ring that maintains the chip seal ring as a continuous barrier to contamination, while at the same time creating a desirable electrical feature in the seal ring that enables the use of an on-chip loop antenna. In one embodiment, at least a portion of the chip seal ring has a serpentine configuration, such as a square wave, triangle wave, or curved geometry, that increases the reactance and resistance of the seal ring so as to mitigate the adverse induced currents created by the magnetic coupling effects between the on-chip antenna and the seal rings, thereby improving the efficiency of an on-chip loop antenna in the presence of the seal ring.

2 Claims, 2 Drawing Sheets

CHIP SEAL RING HAVING A SERPENTINE GEOMETRY

FIELD OF THE DISCLOSURE

The present disclosure generally relates to the field of on-chip antennas. In particular, the present disclosure is directed to a modified chip seal ring for the purpose of mitigating the negative effects of a seal ring and thereby enhancing the operation of an on-chip loop antenna.

BACKGROUND

When it is desirable for a radio frequency (RF) chip, such as a radio frequency identification (RFID) chip, to use an on-chip antenna, one of the most efficient designs to use is a resonant small loop antenna. A small loop antenna is one with a total radiator length (or circumference for a single turn loop antenna) that is less than one quarter of a wavelength. Very often these on-chip loop antenna radiating elements are formed with the largest area single turn loop of a low resistance wire that is broken at one point and, thus, the single turn loop is seen as a one turn inductor. Such loop antennas typically have a tuning capacitor connected across the break and having a capacitance chosen to resonate the antenna at the desired use frequency.

An on-chip loop antenna would work very well if it were not for the usual requirement of having a metallic chip seal ring, or guard-ring, around the perimeter of the integrated circuit. The main purpose of the seal ring is to prevent ionic or other contamination from entering the integrated circuit aboard the chip, since ionic or other contamination can cause a degradation of the operating characteristics of components, such as transistors, within the integrated circuit chip. The presence of the seal ring can significantly reduce the effectiveness of the loop antenna by virtue of the antenna magnetically inducing currents into the seal ring that are opposite to those in the antenna, thereby canceling a sometimes large portion of the magnetic field emanating from the antenna. Also, because the plates of the capacitor on the antenna carry the largest alternating current (AC) voltage as compared with any other point on the antenna, when there is capacitive coupling from the loop antenna near the capacitor to the nearby chip seal ring, the capacitor voltage is shorted out. One solution may be to cut a small gap in the chip seal ring in the region that is adjacent to the antenna capacitor. However, this is typically not permitted in chip manufacturing because of reliability concerns from ionic or other contamination, as described above.

SUMMARY OF THE DISCLOSURE

In one embodiment, the present disclosure is directed to a seal ring on an integrated circuit chip. At least one portion of the seal ring has a serpentine geometry. The integrated circuit chip also comprises a substrate having a lateral outer periphery and a loop antenna applied to the substrate within the lateral outer periphery. Semiconductor circuitry is located within the lateral outer periphery. The seal ring is applied to the substrate and is located continuously around the loop antenna and the semiconductor circuitry and within the lateral outer periphery so as to inhibit ionic or other contamination from reaching the semiconductor circuitry.

In another embodiment, the present disclosure is directed to an integrated circuit chip. The integrated circuit chip comprises a substrate having a lateral outer periphery and an antenna applied to the substrate within the lateral outer periphery and defining a loop shape on the substrate. Semiconductor circuitry is located substantially within the loop shape of the antenna. A metallic seal ring is applied to the substrate and is located continuously around the loop antenna and immediately adjacent thereto so as to substantially conform with the loop shape. The metallic seal ring is provided to inhibit ionic or other contamination from reaching the semiconductor circuitry. At least one portion of the metallic seal ring having a serpentine geometry.

In a further embodiment, the present disclosure is directed to an integrated circuit chip. The integrated circuit chip comprises a substrate having a lateral outer periphery and a loop antenna applied to the substrate within the lateral outer periphery and defining a loop shape on the substrate. The integrated circuit chip further comprises semiconductor circuitry and a metallic seal ring applied to the substrate and located continuously around the loop antenna and immediately adjacent thereto so as to substantially conform with the loop shape. The seal ring is provided to inhibit ionic or other contamination from reaching the semiconductor circuitry and has a repeating-wave geometry that has a wavelength of about 20 microns to about 200 microns and an amplitude of about 10 microns to about 200 microns.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

In one embodiment, the present disclosure includes a chip seal ring, at least a portion of which has a generally serpentine shape to increase the reactance of the seal ring so as to provide an RF choke that enhances the operation of an on-chip loop antenna in the presence of the chip seal ring. The serpentine portion or whole of a seal ring of the present disclosure may have any suitable serpentine geometry, such as a non-repeating or repeating pattern that includes either abrupt or gradual changes in direction, or both, configured to mitigate the adverse magnetic coupling effects of traditional straight-sided chip seal rings and, thereby, improve the efficiency of an on-chip loop antenna located within the chip seal ring. A seal ring of the present disclosure maintains a continuous barrier to contamination, while at the same time creating a more desirable environment for an on-chip loop antenna.

Figure 1:
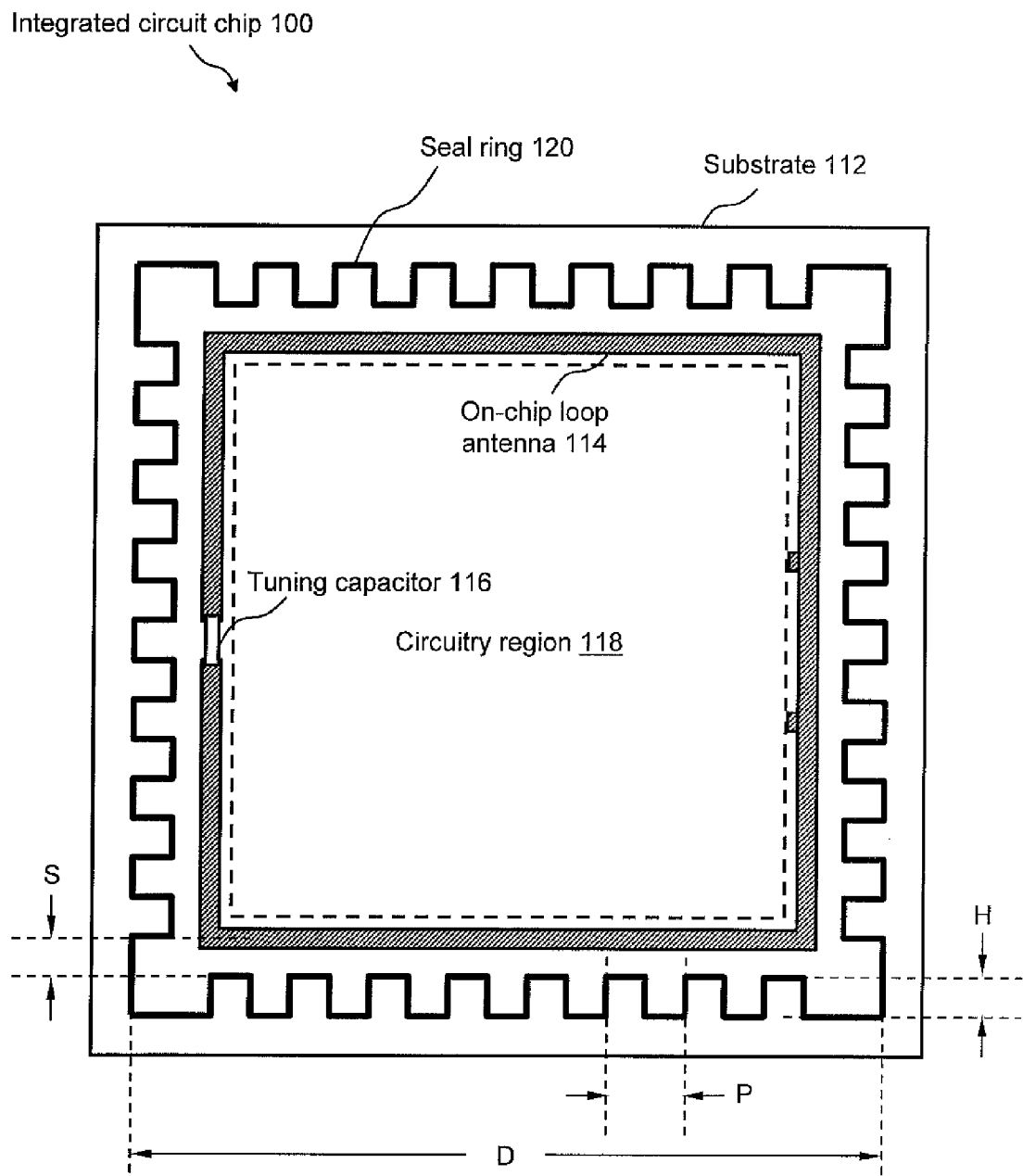
FIG. 1 illustrates a top view of an integrated circuit chip that includes a chip seal ring made in accordance with a first embodiment of the present invention.

FIG. 1 illustrates a top view of an integrated circuit chip 100 that includes a chip seal ring made in accordance with a first embodiment of the present invention. As those skilled in the art will understand, integrated circuit chip 100 may be any chip that utilizes an on-chip loop antenna, such as a radio-frequency identification (RFID) chip, among others. Integrated circuit chip 100 includes a substrate 112 that may be a standard silicon substrate used for semiconductor fabrication. Substrates chosen for integrated circuit chips that include on-chip loop antennas are often formed of more highly resistive doped silicon or other material. An on-chip loop antenna 114 may be formed on substrate 112, along with an associated tuning capacitor 116, which may be located across a break in the antenna. On-chip loop antenna 114 may be, for example, a resonant "small loop" antenna designed for a certain operating frequency. The size of tuning capacitor 116 would typically be chosen to resonate on-chip loop antenna 114 at its intended operating frequency, which may be, for example, but not limited to, microwave frequencies that range between 2.45 gigahertz (GHz) and 5.8 GHz.

On-chip loop antenna 114 may surround a circuitry region 118 of integrated circuit chip 100, which is a region on substrate 112 within which electronic circuitry (not shown), such as circuitry associated with the antenna, may be installed. In the case of an RFID chip, the circuitry in circuitry region 118 may be, for example, circuitry for storing a unique identification number or other information that makes up the identifying information stored on the RFID chip.

Integrated circuit chip 100 includes a seal ring 120 that is located between the outer edges of substrate 112 and on-chip loop antenna 114 and that has at least a portion of its length forming a serpentine shape. As mentioned above, this serpentine shape provides seal ring 120 with an RF choke that increases the inductance and resistance and, thereby, increases the impedance of seal ring 120 so as to reduce the magnitude of the currents induced in seal ring 120 from the mutual magnetic coupling with on-chip loop antenna 114. Seal ring 120 replaces a traditional chip seal ring, which, as discussed in the background section above, would cause significant interference with the operation of on-chip loop antenna 114 by virtue of the antenna magnetically inducing therein currents opposite to the current in the antenna and, thereby, cancel a portion of the magnetic field of the antenna and significantly reduce its radio frequency radiation efficiency.

Figure 2:
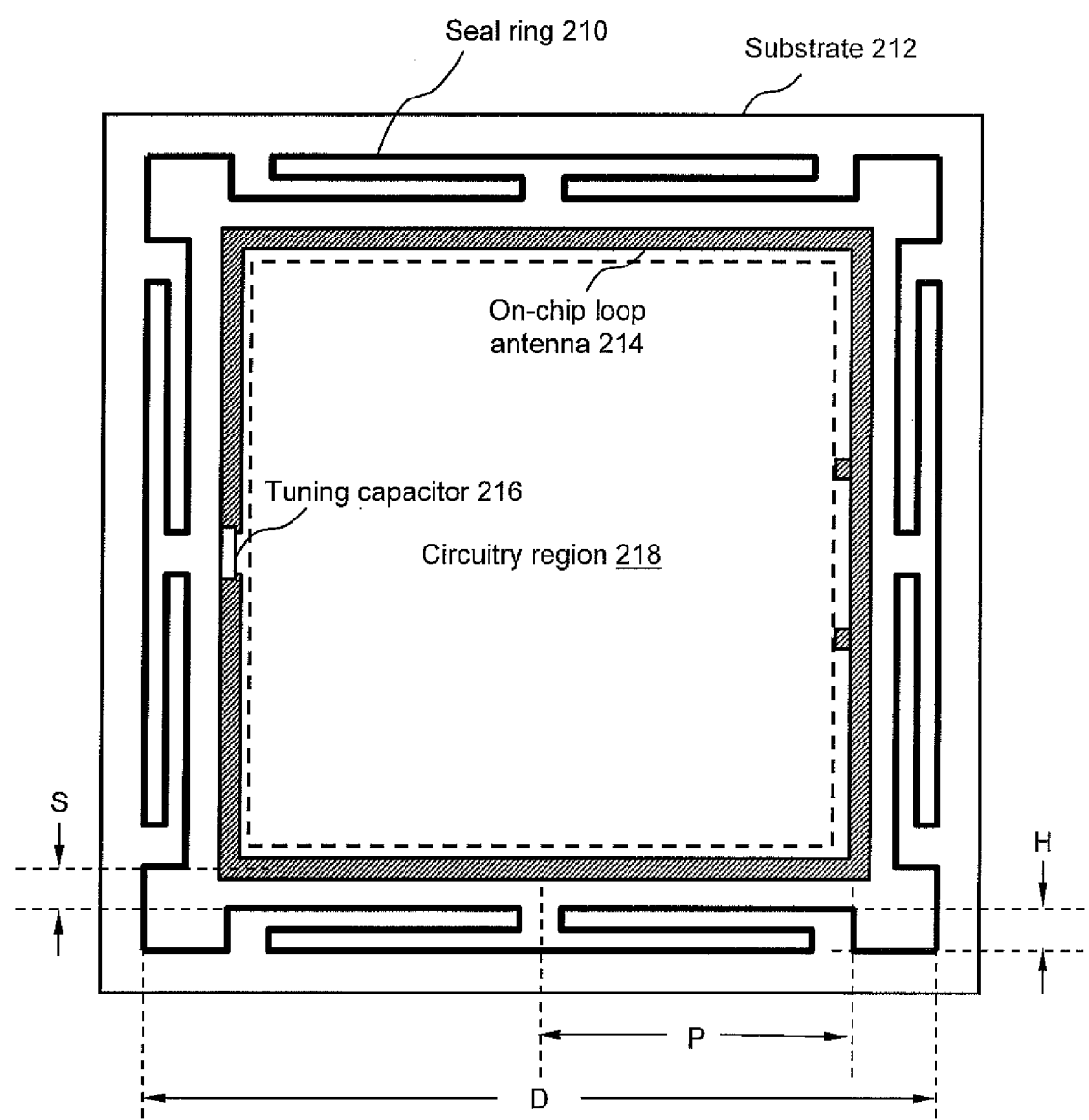
FIG. 2 illustrates a top view of an integrated circuit chip that includes a chip seal ring made in accordance with a second embodiment of the present invention.

In the embodiment shown in FIG. 1, seal ring 120 has fours sides that each have a serpentine, in this example, square-wave, geometry, while maintaining a continuous barrier to contamination. Seal ring 120 is formed of an electrically conductive material, such as, but not limited to, aluminum, copper and alloys of these materials. Seal ring 120 may have any suitable line width, such as, but not limited to, about 5 microns to about 10 microns and a line thickness that to provide a robust barrier should extend through every metal and via layer used to build integrated circuit chip 100. Exemplary line thicknesses include, but are not limited to about 2 microns to about 20 microns. The square wave geometry of seal ring 120 may have a height H of the square wave geometry of serpentine-shaped chip seal ring 120, a pitch P and a spacing S from the center of the conductor of on-chip loop antenna 114 to the center of the inner-most feature of seal ring 120, each of which may be optimized along with the line height and thickness for different applications. For example, these parameters of seal ring 120 may be optimized for differing size chips, differing size antennas and differing operating frequencies. In addition, it is again noted that the serpentine shape of the serpentine-shaped portion of seal ring 120 is not limited to a square wave geometry. For example, triangle wave and curved and other serpentine geometries, including those that double back on themselves in a periodic fashion, such as in linear loaded antenna designs (e.g., as shown in FIG. 2), and combinations thereof may be used. Furthermore, the entire seal ring 120 need not have the serpentine geometry. For example, fewer than all sides of seal ring 120 may have serpentine geometry and/or only a portion of each side may have the serpentine geometry as needed to suit a particular design.

In one example, when seal ring 120 is optimized for an application wherein on-chip loop antenna 114 is tuned to 6 GHz and is a 1.5 millimeter (mm) square loop antenna, height H of the square wave geometry may be 100 microns; the pitch P of the square wave geometry may be 200 microns; the spacing S from the center of the antenna to the inner most feature of the seal ring may be 100 microns; and the overall dimension D of one side of serpentine-shaped chip seal ring 120 may be 1.9 mm.

As a result of these exemplary dimensions, at 6 GHz the radiated electrical (E) field of seal ring 120 is approximately (using a test drive level for the purpose of the comparative study) 0.03 volts/meter (V/m), which is only about −3 dB compared to a standalone loop antenna that has no seal ring 120 present. Importantly, this E-field of seal ring 120 is an improvement over a traditional straight-sided chip seal ring (not shown) that is spaced 100 microns from on-chip loop antenna 114. More specifically, the E-field of the traditional straight-sided chip seal ring may be approximately 0.02 V/m, which is about −6 dB compared to a standalone loop antenna that has no seal ring present. This example indicates that the effective radiated power is doubled using seal ring 120 of the present disclosure compared with a traditional straight-sided chip seal ring. This is an improvement of one-hundred percent. Compared to having no seal ring, seal ring 120 in this example has a loss of about 50% of the possible radiated power compared with a 75% loss if the traditional straight-sided chip seal ring were used.

Another method of quantifying the effectiveness of the serpentine shape and dimensions of seal ring 120 is by measuring the self- and mutual-inductance of the loop antenna 114, without tuning capacitor 116 and with and without the seal ring. This analysis considers loop antenna 114 and seal ring 120 to act as a transformer having a load impedance between zero and infinity and mutual inductive coupling coefficients between zero and one. A zero-impedance seal ring with an inductive coupling coefficient of one would result in the self-inductance of the loop being collapsed to zero Henrys, which would prevent loop antenna 114 from being a useful antenna at all. That is to say, a zero-impedance seal ring would completely shield loop antenna 114 from radiating or receiving radio signals. This would be close to the case in conventional seal-ring designs. In the prior at, to circumvent this situation the seal ring is open circuited at the corners of the integrated circuit so as to increase the impedance of the seal ring to close to infinity. This allows the corresponding loop antenna to operate as if the seal ring were not present, and the self-inductance of this loop is the same as if the seal ring were not present. However, the breaks in the seal ring result in an integrated circuit that will not be reliable due to ionic or other contaminants passing through the openings in the seal ring and, thereby, degrading the devices on the chip.

For the specific case of loop antenna 114 and the seal rings described above, the self-inductance of the loop antenna without the seal ring is 5.215 nanoHenrys, the self-inductance of the loop antenna with the straight sided seal ring (not shown) is reduced to 4.507 nanoHenrys (a 13.6% reduction in self-inductance compared to the no seal ring case) and the self-inductance of the loop antenna with serpentine seal ring 120 is reduced to 5.045 nanoHenrys (a 3.26% reduction compared to the no seal ring case). This small reduction in self-inductance as between the no-seal-ring case and the case of seal ring 120 made in accordance with the present invention means that there is less counter-productive current being induced in seal ring 120, thereby allowing loop antenna 114 and inductor to operate as if it were in a more ideal environment. Note that for any reduction in the self-inductance of the loop radiating element from the chip environment and seal ring there must be a compensating increase in the tuning capacitor value to maintain the desired resonant frequency and efficiency of the loop antenna. The large number of variables, including the shape of the serpentine, allows for more optimum solutions to be developed based on the principles described herein.

FIG. 2 illustrates a top view of an integrated circuit chip 200 that includes a chip seal ring 210 made in accordance with a second embodiment of the present invention. Integrated circuit chip 200 includes a substrate 212, an on-chip loop antenna 214, a tuning capacitor 216, and a circuitry region 218, which may be substantially identical in form, arrangement, and function to substrate 112, on-chip loop antenna 114, tuning capacitor 116, and circuitry region 118, respectively, of integrated circuit chip 100 of FIG. 1.

In the example shown, seal ring 210 is located between the outer edges of substrate 212 and on-chip loop antenna 214 and has at least a portion of its length folding back on itself in order to form a linear loaded serpentine-shaped chip seal ring. As mentioned above, this linear loaded serpentine shape provides seal ring 210 with an RF choke that increases the inductance and resistance and, thereby, increases the impedance of the seal ring in order to reduce the magnitude of the currents induced in the seal ring from the mutual magnetic coupling with on-chip loop antenna 214. Seal ring 210 replaces a traditional chip seal ring, which, as discussed in the background section above, would cause significant interference with the operation of on-chip loop antenna 214 by virtue of the antenna magnetically inducing therein currents opposite to the current in the antenna and, thereby, cancel a portion of the magnetic field of the antenna and significantly reduce its radio frequency radiation efficiency.

In the embodiment shown in FIG. 2, seal ring 210 has fours sides that each have a serpentine geometry and that each have at least a portion of its length folding back on itself, while maintaining a continuous barrier to contamination. Seal ring 210 is formed of an electrically conductive material, such as, but not limited to, aluminum, copper and alloys of these materials. Seal ring 210 may have any suitable line width, such as, but not limited to, about 5 microns to about 10 microns and a line thickness, such as, but not limited to, about 2 microns to about 20 microns, which should traverse every metal and via layer used to build integrated circuit chip 200. Seal ring 210 may have a height H, a pitch P, and a spacing S from the center of the conductor that forms on-chip loop antenna 214 to the center of the inner-most feature of seal ring 210, each of which may be optimized along with the line height and thickness for different applications. For example, these parameters of seal ring 210 may be optimized for differing size chips, differing size antennas and differing operating frequencies.

Overall and relative to conventional straight-sided chip seals, the reactance created by the serpentine shape of a chip seal ring made in accordance with the present invention, such as either of seal rings 120, 210, substantially reduces the magnitude of the induced currents in the seal ring that act to counter the desired fields of the corresponding loop antenna, e.g., loop antenna 114 or loop antenna 214. Furthermore, this same technique of using patterned series inductance in a chip seal ring may be used to isolate noise coupling of RF/analog/mixed signal chips, which can flow through the chip seal ring from noisy parts of the chip in order to quiet parts of the chip. This noise then often couples to the substrate.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. An integrated circuit chip, comprising:
   a substrate having a lateral outer periphery;
   a loop antenna applied to said substrate within said lateral outer periphery;
   semiconductor circuitry located within said lateral outer periphery; and
   a metallic seal ring, applied to said substrate, located continuously around said loop antenna and said semiconductor circuitry and within said lateral outer periphery so as to inhibit ionic or other contamination from reaching said semiconductor circuitry, at least one portion of said metallic seal ring having a serpentine geometry;
   wherein:
   said at least one portion of said metallic seal ring has a serpentine non-repeating geometry; and
   said serpentine non-repeating geometry is a serpentine that is folded back on itself one or more times as in a linear loaded antenna.

2. An integrated circuit chip, comprising:
   a substrate having a lateral outer periphery;
   an antenna applied to said substrate within said lateral outer periphery and defining a loop shape on said substrate;
   semiconductor circuitry located substantially within said loop shape of said antenna; and
   a metallic seal ring, applied to said substrate, located continuously around said antenna and immediately adjacent thereto so as to substantially conform with said loop shape, said metallic seal ring provided to inhibit ionic or other contamination from reaching said semiconductor circuitry, at least one portion of said metallic seal ring having a serpentine geometry;
   wherein:
   said at least one portion of said metallic seal ring has a se serpentine non-repeating geometry; and
   said serpentine non-repeating geometry is a serpentine that is folded back on itself one or more times as in a linear loaded antenna.

* * * * *